United States Patent [19]

de Rudnay

[11] Patent Number: 4,959,524
[45] Date of Patent: Sep. 25, 1990

[54] APPARATUS AND EVAPORATOR FOR METALLIZING FOILS

[76] Inventor: Andre de Rudnay, 16 chemin de Renens, 1004 Lausanne, CH, Switzerland

[21] Appl. No.: 195,519

[22] Filed: May 18, 1988

Related U.S. Application Data

[63] Continuation of PCT DE87/00419 filed Sep. 16, 1987, abandoned.

[30] Foreign Application Priority Data

Sep. 20, 1986 [DE] Fed. Rep. of Germany ....... 3632027

[51] Int. Cl.$^5$ ............................................. C23C 14/26
[52] U.S. Cl. ................................... 219/275; 219/271; 118/727
[58] Field of Search ............................... 219/271–276; 118/726, 727

[56] References Cited

U.S. PATENT DOCUMENTS

| | | | |
|---|---|---|---|
| 2,665,225 | 1/1954 | Godley | 117/107 |
| 2,772,318 | 11/1956 | Holland | 118/726 |
| 3,350,219 | 10/1967 | Shaler | 117/107 |
| 4,576,797 | 3/1986 | Nishiwaki | 219/271 |

FOREIGN PATENT DOCUMENTS

| | | |
|---|---|---|
| 812025 | 7/1949 | Fed. Rep. of Germany . |
| 1908669 | 10/1961 | Fed. Rep. of Germany . |
| 206499 | 1/1984 | Fed. Rep. of Germany . |
| 3239131 | 4/1984 | Fed. Rep. of Germany . |
| 1445545 | 6/1966 | France . |

*Primary Examiner*—Teresa J. Walberg
*Attorney, Agent, or Firm*—Eckert Seamans Cherin & Mellot

[57] ABSTRACT

In order to radically improve the efficiency of evaporators used in vacuum foil coating plants wherein reactive metals such as Al, Ni, Fe and the like are being evaporated, a radiation heater heated up to about 2500° C. is placed in a cavity, the inner wall surface of which carries the liquid evaporant. The liquid evaporant is evaporated and energized by the radiation heater emitting high energy photons and also electrons. The high energy vapor is directed in a beam and reduces evaporant waste caused by stray deposits, and also forms a denser metallic coating on a moving foil being metallized.

10 Claims, 2 Drawing Sheets

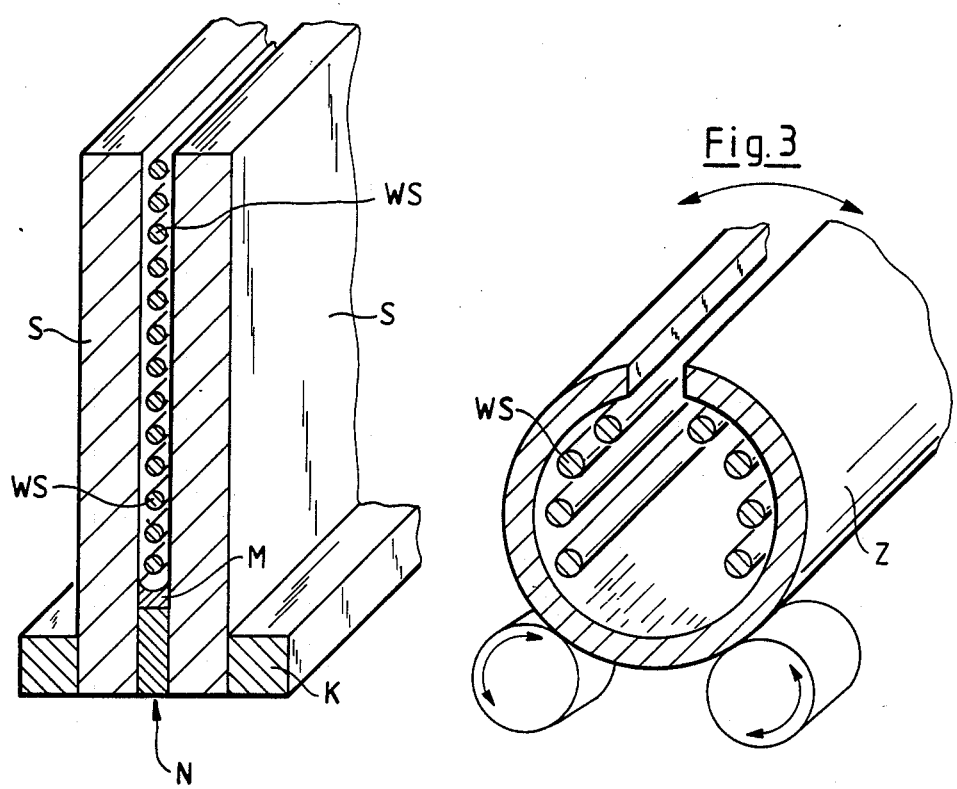
Fig. 1
Fig. 3
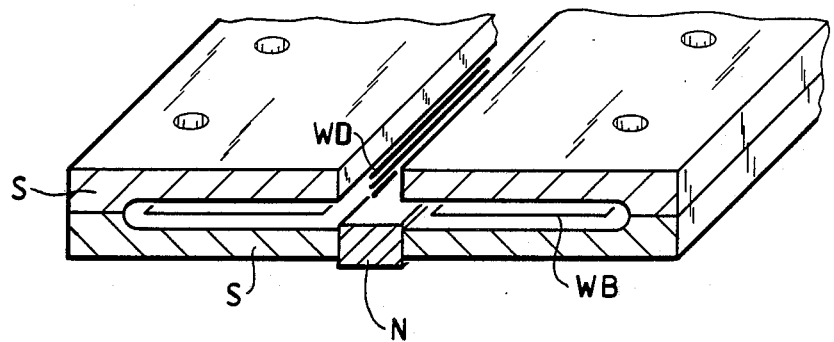
Fig. 2

APPARATUS AND EVAPORATOR FOR METALLIZING FOILS

CROSS REFERENCE TO RELATED APPLICATION

This is a continuation of International Application PCT/DE87/00419, filed 16 Sept. 1987, now abandoned.

BACKGROUND OF THE INVENTION

1. Field of the Invention

This invention concerns an apparatus and evaporator for metallizing foils in a vacuum roll coating plant with reactive metals such as aluminum, nickel, iron, cobalt, etc., and also concerns apparatus and evaporators for carrying out the process. Foil metallizing with reactive metals according to the invention is carried out by roll coating machines operated in vacuum. The invention represents a new development applicable to the art of vacuum roll coating.

2. Prior Art

The art of metallizing foils in vacuum is well developed. To mention but one of the publications relating to it, an article by H. Walter on pages 107 to 134 of the book edited by K. Stoeckhert and entitled "Veredeln von Kunststoff-Oberflachen" (Upgrading of Plastic Surfaces), published by Carl Hanser, Munich and Vienna 1974, describes the use of resistance heated ceramic or intermetallic evaporators or boats still currently used for evaporating onto moving foil. However, several advantages known to characterize other continuous metallizing processes are not achieved when using resistance heated evaporators. Thus, the mask shown in FIG. 5.11 of H. Walter's article applied therein to indirectly heated zinc evaporators, cannot be used on ceramic evaporators or boats. Nor are the latter available in sufficient length to cover the whole width of a modern foil. Several individually controlled ceramic boats become necessary, placed at a boat-to-foil distance of at least 100 mm and thus obviously cancelling the possibility of obtaining strictly identical condensate thickness over the whole width of the foil. Also, the evaporation can only take place in an upward direction, and even so, 70% of the metal evaporated is wasted, being dispersed in the vacuum apparatus where it becomes the source of harmful powder and stray deposits requiring frequent cleaning. Last but not least the evaporation temperature of resistance heated ceramic or intermetallic evaporators or boats cannot exceed 1450-1500° C., which corresponds to a kinetic energy of the evaporant vapor of less than 0.15 electron volts (eV), and even this low and unsatisfactory kinetic energy is further reduced by the isentropic expansion of the vapor leaving the boat, and amounts to at most a few hundredths of an electron-volt when condensing on the foil. The result is a highly porous, gas and vapor permeable, humidity sensitive, often poorly-adhering condensate, the quality of which is very much inferior to that of deposits obtained from high kinetic energy vapor produced by sputtering or electron beam ion plating processes.

The invention aims at the elimination of the above disadvantages of ceramic or intermetallic resistance heated boats. By shaping the foil metallizing source as a cavity or hollow body from which the vapor of the reactive metal emerges as a beam, 80% or more of it can be condensed on the foil. By imparting a higher kinetic energy to the vapor (that no longer loses most of its kinetic energy by unwanted spreading), the quality of the condensate is considerably improved. The heater function is transferred from the electrically unstable multi-component ceramic or intermetallic boat to a radiation heater placed in the cavity and made of perfectly controllable high-melting-temperature metals or refractory conductors such as tungsten, tantalum, molybdenum, high-melting-temperature carbide or boride and the like. Any of these can be produced in considerable lengths and of uniform quality, whereby evaporators of any length can be built. By heating the radiation heater to a temperature sufficiently high to ensure a copious emission of electrons, some of these are attached to the vapor atoms of aluminum or to other vapor atoms or molecules known to have an affinity for electrons. Otherwise the emitted electrons and photons are useful for impact ionization of the vapor. The electrons emitted by the radiation heater can also be used for both impact ionizing the metallic vapor, and assisting the high energy thermal photons in vaporizing the liquid to be evaporated. In all these cases, the high temperature radiation heater provides the metallic vapor with high kinetic energy that can be further increased by the known process of accelerating the metallic vapor in an electric field.

As the temperature of the radiation heater is too high for a chemical reaction (corrosion) to occur with the vapor cloud surrounding it, the vapor cloud extends rather than shortens the useful life of the radiation heater, as can be seen in Langmuir's formula where it is shown that the increase of the pressure of a chemically inactive vapor diminishes the evaporation rate of the heater material. The usual electrochemical corrosion occurring in resistance heated ceramic or intermetallic boats is absent in radiation heated inner walls of cavities or hollow bodies that serve as a support for the liquid evaporant; their corrosion is consequently reduced, resulting in a particularly long-life evaporator.

SUMMARY OF THE INVENTION

It is an object of the invention to provide foil metallizing apparatus with indirectly heated evaporators instead of resistance heated ones when evaporating reactive metals such as aluminum. However, unlike the indirectly heated boats for evaporating zinc as shown in the aforementioned book at FIG 5.13, where the heater surrounds a boat or other liquid-containing receptacle, and wherein the radiated heat, i.e., the thermal photons, comes from the very wall of the cavity, the liquid according to the inventive process appears on and is borne by the inner wall of the cavity that is heated by the thermal photons originating from a radiation heater. The radiation heater also does not touch the reactive liquid evaporant but is placed in the cavity. The thermal photons heat the cavity material, namely a high-melting-temperature chemically-resistant, and preferably also good heat-conducting material such as boride or carbide or beryllium oxide or boron nitride or tungsten or the like. The cavity material in turn transmits its heat by thermal conduction to the liquid evaporant spread over it or over part of it or issuing from its pores or capillaries. Meanwhile the liquid evaporant thus brought to a higher temperature and mostly also increased photon absorption state, is also directly heated by said photons and is brought to evaporation.

In order to facilitate evaporant spreading over the inner surface of the cavity, the cavity is preferably provided with capillaries used for taking up and holding the liquid evaporant that is fed to the evaporator in foil or powder or conventional wire or liquid form. The shape of the radiation heater is preferably such as to provide for both melting and evaporation of the reactive metal. The inventive process thus is related to sublimation methods used to evaporate SiO, Cr, etc., and in particular is related to the subject matter of German Patent Application DE 35 30 106-A1 of Elektroschmezwerk Kempten GmbH, D 8000 Munchen, wherein continuous feeding of subliming materials is described. Instead of subliming solid material as in these methods, the present invention concerns the evaporation of molten reactive metals that could up to now not be continuously evaporated in foil coating plants by radiation heating methods because only when a molten reactive metal is borne by the inside of a sufficiently large cavity wall can the quantity of vapor required for metallizing foils at the usual speed of 6 to 12 meters/second be produced by a thermal radiation heating method.

An important object of the invention is to make the inside of the cavity or hollow body a particularly efficient photon-absorbing material. Most of the corrosion resistant refractory materials mentioned above are characterized by appreciable photon absorption at the temperatures concerned, but even the less photon-absorbent materials such as $Al_2O_3$, BN, etc., can be made more photon receptive and absorbent by providing them with small cavities, i.e., pores and capillaries that are normally considered undesirable in resistance heated ceramic or intermetallic evaporators. Such highly photon absorbent material appears dark or gray, and it is therefore an object of the invention to make the inner layer of the cavity dark or gray, in addition to being corrosion resistant, of high melting temperature, and a good conductor of heat. This contrasts with the properties preferred for the outside of the cavity-defining structure that should for obvious reasons be as liquid impermeable, i.e., free from open pores and capillaries, as possible.

These objects are achieved in various ways. The inner layer can be made separate from an impermeable outer one, feeding the reactive metal between the two, so that the metal can permeate the inner porous layer from which it is subsequently evaporated. A dense outer layer can be separated from a porous inner layer by a middle layer preferably made of the same material as the inner layer, but having much larger pores, capillaries or channels to which the evaporant is fed by gravity, being melted and then passed through the finer pores of the cavity. A dense outer shell can be directly coated on its inner side with capillary and porous material. The inner side can be transformed by chemical or physical action into such material. All of a relatively thick walled cavity, for example 3 to 10 mm thick, can be made of the same porous material, and the reactive metal to be evaporated is then fed to the inner side on which is spreads and from which it evaporates, while the flow of the molten reactive metal to the outer side of the cavity or hollow body follows the rules of Juvin and Poiseuille, being considerably slowed down by increasing friction due to the decreasing temperature along the important temperature gradient over the thick porous cavity wall. Accordingly, only a fraction of the refractory metal fed to the inner side of the wall can evaporate from the outer side. The outer side of a porous shell can be made more dense or made impermeable by physical or chemical means. Other means are also possible.

A further object of the invention is to produce long evaporators covering the whole width of a foil to be metallized. This object can be achieved not only by producing single long specimens according to the invention, but also by lining up shorter specimens. The lined-up shorter specimens do not have to have perfect electrical contacts as required for resistance heated ceramic or intermetallic boats and therefore can be made into a line of any required length. The advantages of zinc evaporators, including the possibility of using exchangeable masks, are therefore realized, with the added advantage that the masks if necessary can also be used for carrying masts or hooks supporting long radiation heaters made of rods or coils or strips or the like. However, full length radiation heaters are not an absolute necessity when operating long evaporators, in view of the fact that radiation heaters made of tungsten and the like can be split up into strictly identical heating elements that in turn can be connected in series or in parallel or each connected to and heated by an individual power supply.

Another object of the invention is to concentrate most of the radiated heat in the cavity or hollow body, and thus to prevent thermal damage to the foil. In addition to the use of known methods such as heated vapor deflectors and the like, the new method of shaping the radiation heater as a cavity whose opening or openings are directed against the wall carrying the molten evaporant, has been found particularly efficient. According to this method, the wall carrying the molten reactive metal evaporant receives near-black body radiation, while the radiation from the exterior part of the radiation heater, i.e., the radiation originating from the part facing the outlet of the evaporant vapor, corresponds to the radiance of the heater material only, being less than one third of the black body radiation which would occur if tungsten heated to 2500° C was used as radiation heater material. Another possibility is to set slits or small holes or other vapor dispensing openings of the cavity or hollow body in positions where they shade the foil, so that only the vapor, and not the direct radiation of the heater, reaches the foil.

The invention also makes it possible to co-evaporate several metals, and to put down several vacuum coatings on a foil supported by the same capstan roll. The former can be done by feeding to the same cavity several metals, or by feeding each metal to an individual cavity, while the latter is made possible by the facility with which openings in the cavity can be made in any direction, so that individual evaporators can be provided not only under the capstan roll, but also on both of its sides.

BRIEF DESCRIPTION OF THE DRAWINGS

The following examples as shown in the drawings are intended to illustrate the invention and should not be construed in limitation thereof. In the drawings, FIG. 1 is partial perspective view of an embodiment of the invention;

FIG. 2 partial perspective view of an alternative embodiment, disposed-flat as compared to FIG. 1;

FIG. 3 perspective view of a further alternative embodiment, and;

DETAILED DESCRIPTION OF THE PREFERRED EMBODIMENTS

EXAMPLE 1

Figure 4:
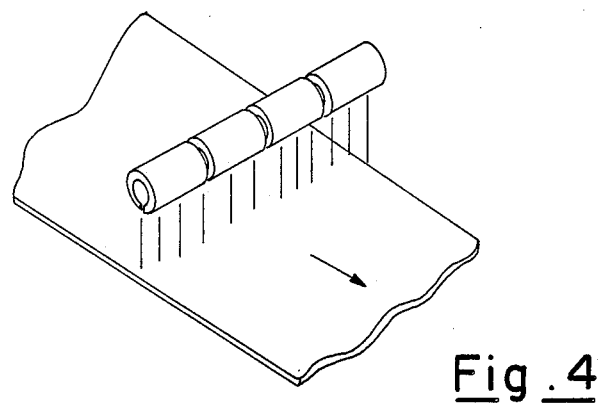
FIG. 4 is a schematic perspective view showing an elongated evaporator formed by a plurality of hollow bodies in line.

Referring to FIG. 1, an evaporation source comprises an evaporator made of a high-melting-temperature metal or other compound not attacked, or only very slowly attacked, by the molten evaporant. Porous plates S are separated by a ledge-shaped porous plug N and are held in place by the clamps K. Tungsten coils, wires or rods WS are suspended in the cavity thus formed, the coils being heated up to 2500° C. After the inside of the cavity has reached a temperature of about 1000° C., aluminum wire is fed to the top, side or bottom of the cavity, and spreading of the molten aluminum can be facilitated by, holes or channels made within the walls of the cavity (see, e.g., FIG. 2). The molten aluminum spreads by capillary action, appearing on and being carried by the inner side of the cavity. The aluminum feeding mechanism is the same as currently used in resistance heated ceramic or intermetallic evaporators, as shown in FIG. 5.12 of H. Walter's aforementioned article.

The thermal photons emitted by WS heat both pores and capillaries of the inner sides of the cavity and the liquid aluminum they contain. Intensive evaporation of the aluminum begins at about 1500° C. The vapor picks up electrons emitted by the coils or the like WS, streams out through the opening between the two plates S and condenses on a plastic, paper, textile, or metallic foil moving above it. Since ionization of the vapor takes place in the cavity or hollow body formed by plates S and plug N, no residual gases or other impurities which may be present in the vacuum chamber are ionized at the same time.

An aluminum layer condensed according to the invention on a foil moved over a water-cooled capstan roll was subsequently examined by X-rays and compared with an aluminum layer evaporated on the same foil from a conventional resistance heated intermetallic or ceramic boat. While the latter condensed aluminum layer exhibits only the 111 reflection line and a strong and broad 200 reflection line, the aluminum layer evaporated from the new evaporator shows a decrease of the 200 reflection line and appearance of the 220 and 311 reflection lines. This shows that the latter layer does not consist of the same porous structure as the one condensed when evaporating from resistance heated ceramic or intermetallic evaporators. A further increase of the kinetic energy by an electrical field makes it possible to obtain densities equivalent to those obtained by the much slower sputtering and ion plating methods.

In the above short description it has not been possible to describe all feasible alternative forms of the new vertical evaporators. In particular, and as already stated above, the cavity walls may consist not only of single plates, but also of double or triple ones, and the individual plates may be made detachable and the evaporant may be fed into any part of the evaporator system, including the space between individual panels or plates or layers. Alternatively, the whole cavity, together with the possible holes or channels, may be made as a single piece instead of an assembly of various parts. Any type of mask can be used on top of the evaporator, and any kind of continuous aluminum or other reactive metal feed can be accommodated. In addition to conventional radiation heater shapes, the radiation heater itself may also be shaped as a cavity, either by shaping it as an array of strips, the edges of which come close to the plates and thus form cavities, or by giving it any other shape, the opening of which is turned towards the liquid evaporant.

While it has so far been assumed that the means defining the cavity carrying the molten evaporant and the radiation heater should form two separate components of the new evaporator, uniting both into a single piece is also possible. As an example, both the radiation heater and the melt carrying cavity can be cut out of the same block of a porous high-melting-temperature electrical conductor, the radiation heater being shaped like a broad hairpin, the leads of which support the two vertical plates of the melt-carrying cavity. Whether produced as a single piece or as an assembly of distinct components, heat reflectors and thermal insulation material can be placed around the new evaporators, providing for a heat insulation not possible with conventional evaporators.

EXAMPLE 2

FIG. 2 shows a flat alternative embodiment as compared to the vertical evaporator shown in FIG. 1, and in addition to being low and wide, it has the following distinctive features:

Firstly, the central plug N can be made not only of dense, but also porous material, and thereby used for drawing up and distributing molten reactive metal within the cavities S. The reactive metal can be melted in a container (not shown) placed under the evaporator and drawn therefrom by plug N. FIG. 4 shows an embodiment wherein a long evaporator covering a whole width of a foil is obtained by lining up a plurality of short evaporators.

Secondly, the two cavities can be fed with distinct materials, so that a two-component vapor can be produced, to which a third component can be added if plug N is used for drawing up a third component. As there is a separate radiation heater WB provided for each side of the evaporator, the particular optimum temperature can be maintained by the separate heater for the particular component subject to said heater.

Thirdly, fine and preferably thoriated tungsten wires WD are suspended in the evaporator opening, used for providing the evaporant vapor with a particularly efficient source of electrons. They can also be used as cathodes or even as anodes if it is desired to produce positive ions instead of negative ones, and the opening of the evaporator can in such a case serve as the other electrode.

EXAMPLE 3

FIG. 3 shows another embodiment again in a schematic representation. A cylindrical cavity Z is formed by an element turned around the radiation heaters WS, or around a single large radiation heater in any direction, so as to direct the vapor stream flowing out through a slit or hole shaped opening, onto any part of a capstan roll.

Although a few illustrative schematic descriptions have been given above, it is not intended that the invention should be limited to them. The invention should be considered in accordance with the spirit and scope of the appended claims.

I claim:

1. An evaporator especially for directing and condensing on a moving substrate high energy vapor beams of reactive metals, comprising in combination a hollow body having at least one opening shaped to substantially compress into a beam all vapor produced by said evaporator, within said hollow body, a container for holding liquid evaporant, said container being made of a photon absorbing and chemically resistant material, also within said hollow body, a radiation heater for heating said liquid evaporant indirectly through contact with said photon absorbing contained, and also directly, through direct photon absorption, the improvement wherein said evaporator comprises means for substantially distributing said liquid evaporant also directly heated by photon absorption, into a plurality of photon absorbing small containers shaped as capillaries, whereby said liquid evaporant is held by capillary forces in any convenient position and is more efficiently heated to fast evaporation through increased heat transmission due to the increased container/liquid interface, the capillaries being positioned around said radiation heater, whereby said vapor releasing capillaries are simultaneously useful as partial heat insulators.

2. The evaporator defined in claim 1 wherein the diameters of said capillaries are progressively reduced in a direction of said radiation heater, with resultant flow of said liquid evaporant towards said radiation heater.

3. The evaporator defined in claim 1, wherein said hollow body is composed of a plurality of hollow bodies aligned end to end to form an elongated evaporator dispensing long and narrow vapor beams out of short individual hollow bodies.

4. The evaporator defined in claim 1 wherein means are provided for turning said opening of said hollow body in any direction, whereby said evaporators become useful as evaporators positioned round the capstan roll of a foil metallizing plant.

5. The evaporator defined in claim 1 wherein said radiation heater is also shaped as a hollow body, useful for concentrating heat on chosen parts of said capillaries.

6. The evaporator defined in claim 1 wherein means are comprised for ionising said vapor before it leaves said hollow body, whereby additional energy is imparted to said vapor beams and their contamination by co-ionization of residual gas impurities present int he vacuum recipient avoided.

7. The vaporator defined in claim 1 wherein said evaporator comprises ducts useful for channelling said liquid evaporant to said capillaries.

8. The evaporator defined in claim 1 wherein said hollow body is made of physically and chemically different materials, useful for supporting material best suited for capillaries, by another material particularly suited as a rigid frame.

9. The evaporator defined in claim 1 wherein means are comprised for intercepting photons directly directed to said moving substrate, with consequent reduction of the radiated heat load on said substrate.

10. The evaporator defined in claim 1 wherein the outside of said capillaries positioned around said radiation heater is sealed off, with consequent impermeability to vapor and liquid, useful for substituting a simple cooled metallic heat shield to the ceramic insulators normally used in high vacuum evaporation technology.

* * * * *